(12) United States Patent
Kakerow et al.

(10) Patent No.: US 7,167,685 B2
(45) Date of Patent: Jan. 23, 2007

(54) FREQUENCY DIVISION

(75) Inventors: Ralf Kakerow, Düsseldorf (DE); Markus Müller, Bochum (DE); Stephan Böcker, Bochum (DE)

(73) Assignee: Nokia Corporation, Espoo (FI)

( * ) Notice: Subject to any disclaimer, the term of this patent is extended or adjusted under 35 U.S.C. 154(b) by 387 days.

(21) Appl. No.: 10/883,641

(22) Filed: Jun. 30, 2004

(65) Prior Publication Data
US 2006/0003725 A1    Jan. 5, 2006

(51) Int. Cl.
*H04B 1/40* (2006.01)
*H04B 1/18* (2006.01)
*H04B 15/00* (2006.01)
*H04B 1/06* (2006.01)

(52) U.S. Cl. .................. 455/76; 455/260; 455/180.3; 455/313; 327/156

(58) Field of Classification Search .............. 455/76, 455/260, 182.1, 313, 314, 180.3, 196.1, 255, 455/165.1; 375/215, 376; 331/34; 327/117, 327/156, 147

See application file for complete search history.

(56) References Cited

U.S. PATENT DOCUMENTS

| | | | | |
|---|---|---|---|---|
| 4,271,531 A | * | 6/1981 | Torii et al. ............... | 455/182.1 |
| 5,257,294 A | * | 10/1993 | Pinto et al. ................. | 375/376 |
| 5,471,502 A | * | 11/1995 | Ishizeki ....................... | 375/376 |
| 7,102,399 B2 | * | 9/2006 | Wu ............................. | 327/156 |
| 2006/0087350 A1 | * | 4/2006 | Ruffieux ..................... | 327/117 |
| 2006/0170464 A1 | * | 8/2006 | Muller ........................ | 327/117 |

FOREIGN PATENT DOCUMENTS

| | | |
|---|---|---|
| DE | 38 10705 | 10/1989 |
| DE | 195 03 052 | 8/1996 |
| EP | 0 537 616 | 4/1993 |
| GB | 2 231 136 | 11/1990 |

OTHER PUBLICATIONS

"A Family of Low-Power Truly Modular Programmable Dividers in Standard 0.35- μm CMOS Technology", Vaucher et al., IEEE Journal of Solid-State Circuits, vol. 35, No. 7, Jul. 2000, pp. 1039-1045.

* cited by examiner

*Primary Examiner*—Aung Moe

(57) ABSTRACT

The invention relates to a method of operating a frequency divider. The frequency divider includes a plurality of divider cells arranged in a chain. Each divider cell is adapted to divide a frequency of an input signal with one of two enabled division ratios in accordance with an applied division ratio control signal, and each divider cell but the last is adapted to provide a frequency divided signal as an input signal for a respective next divider cell. In order to enable a Fractional-N division, the method comprises receiving and buffering a new division ratio control signal for each of the divider cells, and synchronizing an application of the buffered division ratio control signals to the divider cells with a status of a current division cycle. The invention relates equally to a corresponding frequency divider, PLL frequency synthesizer, RF front end, device and system.

15 Claims, 3 Drawing Sheets

FREQUENCY DIVISION

FIELD OF THE INVENTION

The invention relates to a method of operating a frequency divider and to a frequency divider. The invention relates moreover to a communication device, to a phase-locked-loop frequency synthesizer and to a radio frequency front end including such a frequency divider.

BACKGROUND OF THE INVENTION

A frequency divider enables a frequency division of an input signal with a known division ratio, in order to obtain a signal having a desired frequency.

Frequency dividers are employed for example in radio frequency (RF) front-ends used for wireless data transmissions, and more specifically in phase-locked loop (PLL) architectures of frequency synthesizers of such RF front-ends.

Conventional frequency dividers include a dual-modulus prescaler and two programmable counters. The respectively required division ratio is set by programming the counters.

As described in the document 'A Family of Low-Power Truly Modular Programmable Dividers in Standard 0.35-μm CMOS Technology', IEEE Journal of solid-state circuits, vol. 35, No. 7, July 2000, by Cicero S. Vaucher, Igor Ferencic, Matthias Locher, Sebastian Sedvallson, Urs Voegeli and Zhenhua Wang, such conventional frequency dividers have several disadvantages, though.

A frequency divider making use of counters is not based on a modular concept. Moreover, the counters represent a substantial load at the output of the dual-modulus prescaler, which results in a high power consumption of the frequency divider. This is of particular disadvantage when the frequency divider is to be used in mobile devices. Further, the use of counters in addition to a prescaler implies a higher effort for design and layout of the frequency divider.

In the cited document 'A Family of Low-Power Truly Modular Programmable Dividers in Standard 0.35-μm CMOS Technology', it is therefore proposed to use instead a modular frequency divider which is based on 2/3 divider cells.

The basic architecture of such a modular frequency divider is illustrated in the block diagram of FIG. 1.

The frequency divider comprises n 2/3 divider cells 15-1, 15-2, 15-3, . . . , 15-n arranged in a chain, where n is a natural number. The frequency divider enables a programmable division of an input frequency. Each divider cell 15-1 to 15-n includes to this end two functional blocks (not shown).

The first functional block of a divider cell 15-x is a prescaler logic block, which divides the frequency of an input signal and which outputs a frequency divided signal $F_x$, where x=1 to n is the ordinal number of a respective divider cell. For the frequency division, the prescaler logic block can use a division ratio of two or a division ratio of three. The signal $F_x$ output by the n−1 first divider cells 15-x=15-1 to 15-(n−1) is provided to the respective next divider cell 15-(x+1)=15-2 to 15-(n) in the divider chain.

The second functional block of a divider cell 15-1 to 15-n is an end-of-cycle logic block, which determines the division ratio to be used by the prescaler logic block of the same divider cell. The end-of-cycle logic block of each divider cell 15-1 to 15-n receives a dedicated control signal $p_0$ to $p_{n-1}$ via a programming input. The end-of-cycle logic block of the last divider cell 15-n in the divider chain receives in addition a fixed end-of-cycle signal $mod_n$ via a feedback input. The end-of-cycle logic block of all other divider cells 15-x, with x=1 to (n−1), receives in addition via a feedback input an end-of-cycle signal $mod_x$ output by the end-of-cycle logic block of the respective next divider cell 15-(x+1) in the divider chain.

The divider cells 15-1 to 15-n are programmed by setting the division ratio control signals $p_0$ to $p_{n-1}$.

During a division operation, the first divider cell 15-1 receives an input signal $F_{in}$ and provides a frequency divided signal $F_1$ to the second divider cell 15-2. Each further divider cell 15-x, with x=2 to n, receives a signal $F_{x-1}$ from the respective preceding divider cell 15-(x−1) in the division chain and outputs a further frequency divided signal $F_x$. By default, each divider cell 15-1 to 15-n divides an input signal by two.

Upon completion of a division cycle, however, the last divider cell 15-n in the divider chain generates an end-of-cycle signal $mod_{n-1}$, which propagates with each clock cycle of a respective input signal $F_x$ to a respective preceding divider cell 15-x as an end-of-cycle signal $mod_x$, with x=n−1 down to 1. The term division cycle refers to the current clock period of the signal $F_n$ output by the last divider cell 15-n. The signal $mod_{n-1}$ forms at the same time the output signal $F_{out}$ of the frequency divider.

When the end-of-cycle signal $mod_x$ becomes active at the feedback input of an end-of-cycle logic block, the end-of-cycle logic block controls the prescaler logic block of the same divider cell 15-x in a way that the division ratio applied by the prescaler logic block is two or three. An active signal $mod_x$ at the feedback input enables a divider cell 15-x to divide the frequency of an input signal $F_{x-1}$ once by three, provided that the control signal $p_x$ at the programming input is set to '1'. Otherwise, a division by two is carried out as before.

By choosing appropriate control signals $p_0$ to $p_{n-1}$ for the divider cells 15-1 to 15-n of the divider chain, the total division ratio of the frequency divider can thus be set to a desired value.

The presented modular frequency divider offers various advantages when used for an Integer-N division, that is, for a division of an available frequency by an integer factor N. The modular approach and the easy optimization for a low power consumption allow using this divider architecture in Integer-N PLL architectures of frequency synthesizers.

However, while this modular frequency divider is well suited for an Integer-N PLL operation, it is not suited for a Fractional-N PLL operation, in which an available frequency is to be divided by a fractional factor N.

In an Integer-N division, the division ratio control signals are adjusted once for a desired output frequency. These division ratio control signals can then be maintained until another output frequency is desired. For a Fractional-N division, in contrast, the division ratio control signals have to be varied repeatedly for achieving the desired output frequency.

A Fractional-N PLL requires more specifically a frequency divider that is able to switch the division ratio for each division cycle without latency. This is necessary, because a delta-sigma modulator, which usually provides the division ratio control signals for a frequency divider inside a Fractional-N PLL, changes the control signals after each period of a reference frequency representing the desired output frequency. In a Fractional-N mode, the division ratio will thus be changed during a respective division cycle. This poses the problem that the division is performed with the old division ratio in divider cells that have been passed in the division cycle, and with the new division ratio in divider cells that will only be passed after the change of the control signals. The result is an invalid division ratio for the current division cycle.

Therefore, mostly the conventional frequency dividers, consisting of a multi-modulus prescaler and two counters, are still used for realizing a Fractional-N PLL of a frequency synthesizer.

SUMMARY OF THE INVENTION

It is an object of the invention to enhance conventional frequency divisions. It is in particular an object of the invention to enable Fractional-N divisions by means of a modular frequency divider.

A method of operating a frequency divider is proposed. The frequency divider includes a plurality of divider cells arranged in a chain. Each divider cell is adapted to divide a frequency of an input signal with one of at least two enabled division ratios in accordance with an applied division ratio control signal. Further, each divider cell but the last one in the chain is adapted to provide a frequency divided signal as an input signal for a respective next divider cell in the chain. The proposed method comprises receiving and buffering a new division ratio control signal for each of the divider cells. Further, the proposed method comprises synchronizing an application of the buffered division ratio control signals to the divider cells with a status of a current division cycle.

Moreover, a frequency divider is proposed which comprises a plurality of divider cells arranged in a chain, each divider cell being adapted to divide a frequency of an input signal with one of at least two enabled division ratios in accordance with an applied division ratio control signal, and each divider cell but the last one in this chain being adapted to provide a frequency divided signal as an input signal for a respective next divider cell in the chain. The proposed frequency divider further comprises at least one synchronization component adapted to receive and buffer a new division ratio control signal for each of the divider cells, to apply the buffered division ratio control signal to the divider cells, and to synchronize an application of the buffered division ratio control signals to the divider cells with a status of a current division cycle.

The proposed frequency divider can be an Integer-N and/or Fractional-N frequency divider.

Moreover, a PLL frequency synthesizer, an RF front-end and a communication device are proposed, each comprising the proposed frequency divider. The proposed communication device can be for instance a mobile terminal, but equally any other communication device making use of frequency dividers for generating a desired frequency.

Finally, a communication system is proposed, which comprises at least one communication device with the proposed frequency divider.

The proposed communication system can be in particular a Global System for Mobile communications (GSM), a Wideband Code Division Multiple Access (WCDMA) based system or a High Speed Downlink Packet Access (HSDPA) based system, but equally any other communication system making use of frequency dividers for generating a desired frequency.

The invention proceeds from the consideration that for a proper frequency division, a change of division ratio control signals should not affect an ongoing division cycle. It is therefore proposed that the application of new division ratio control signals to the divider cells is synchronized with a status of a respective division cycle. The term division cycle refers to a signal period of the signal output by the last divider cell of a chain of divider cells.

It is an advantage of the invention that it allows providing new division ratio control signals to a modular divider chain at a suitable point of time of a division cycle. With this approach, a modular concept can be used as well for a Fractional-N division.

Compared to conventional solutions for Fractional-N divisions, a modular concept results in a lower power consumption. Further, it enables a simple power optimization by scaling static and dynamic currents according to the maximum frequency in each divider cell. Moreover, the modular approach drastically reduces design and verification efforts.

In one embodiment of the invention, the last divider cell in a chain of divider cells provides an end-of-cycle signal whenever it has completed a division cycle.

An end-of-cycle signal provided by the last divider cell propagates from the last divider cell via all divider cells in the chain to a first divider cell in the chain. Each of the divider cells uses a first one of the at least two division ratios by default. Only when receiving an end-of-cycle signal, a divider cell uses the second one of the at least two division ratios once, if required by a currently applied division ratio control signal. The status of a division cycle which is considered for synchronizing the application of the division ratio control signals to the divider cells may then be related to this end-of-cycle signal.

The status could be given for instance when the end-of-cycle signal is provided by the last divider cell. Thereby, it can be ensured that the new division ratio control signals will be considered for all divisions of the next division cycle in which the second division ratio might have to be employed. All divisions which have already been carried out at this point of time for the next division cycle by the divider cells except for the last had to be based on the first division ratio anyhow, as no end-of-cycle signal was present. The presence of an end-of-cycle signal can be monitored to this end.

The at least two enabled division ratios may comprise exactly two division ratios or more division ratios. Further, the enabled division ratios may be two and three, as in the known 2/3 divider cells, but equally any other combination of division ratios. Regardless of the enabled division ratios, it should only be taken care that a change of the division ratio control signals does not affect the current division cycle.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 2:
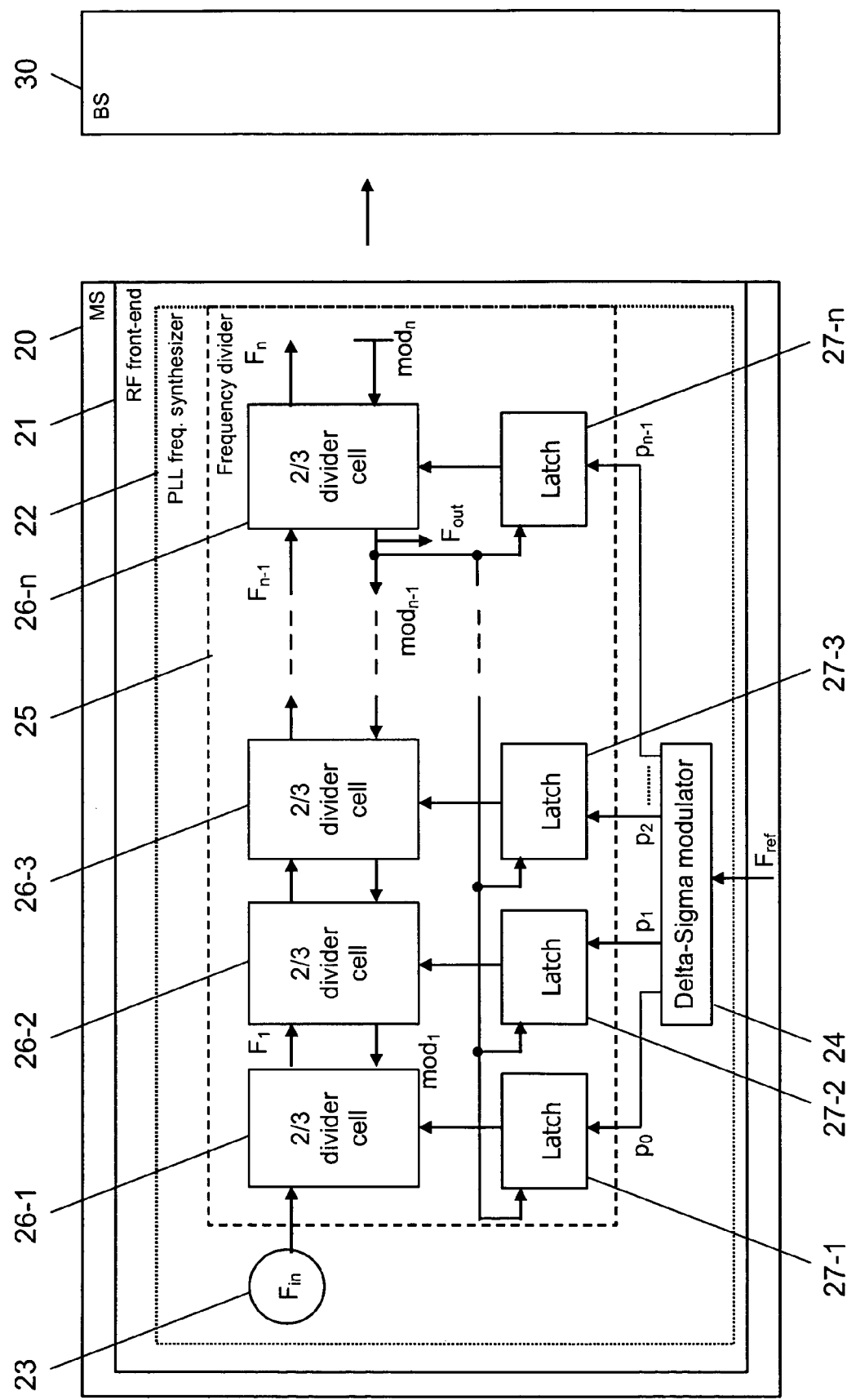
FIG. 2 is a schematic block diagram of a system according to an embodiment of the invention.

FIG. 2 schematically presents a system employing a modular frequency divider which enables a Fractional-N division.

The system comprises by way of example a mobile station MS 20 and a base station BS 30.

The mobile station 20 includes an RF front-end 21 with a PLL frequency synthesizer 22.

The PLL frequency synthesizer 22 comprises a signal generator 23 generating a radio frequency signal $F_{in}$, a delta-sigma modulator 24 and a frequency divider 25. The signal generator 23 can be for example a voltage controlled oscillator. The delta-sigma modulator 24, the signal generator 23, and the frequency divider 25 may form part, for instance, of a Fractional-N PLL.

The frequency divider 25 includes a chain of n 2/3 divider cells 26-1, 26-2, 26-3, . . . , 26-n, where n is a natural number. For each divider cell 26-1 to 26-n, the static and dynamic currents are scaled according to the maximum frequency which is to be processed, in order to optimize the power consumption of the frequency divider 25. The frequency divider 25 enables a programmable division of an input frequency.

Figure 1:
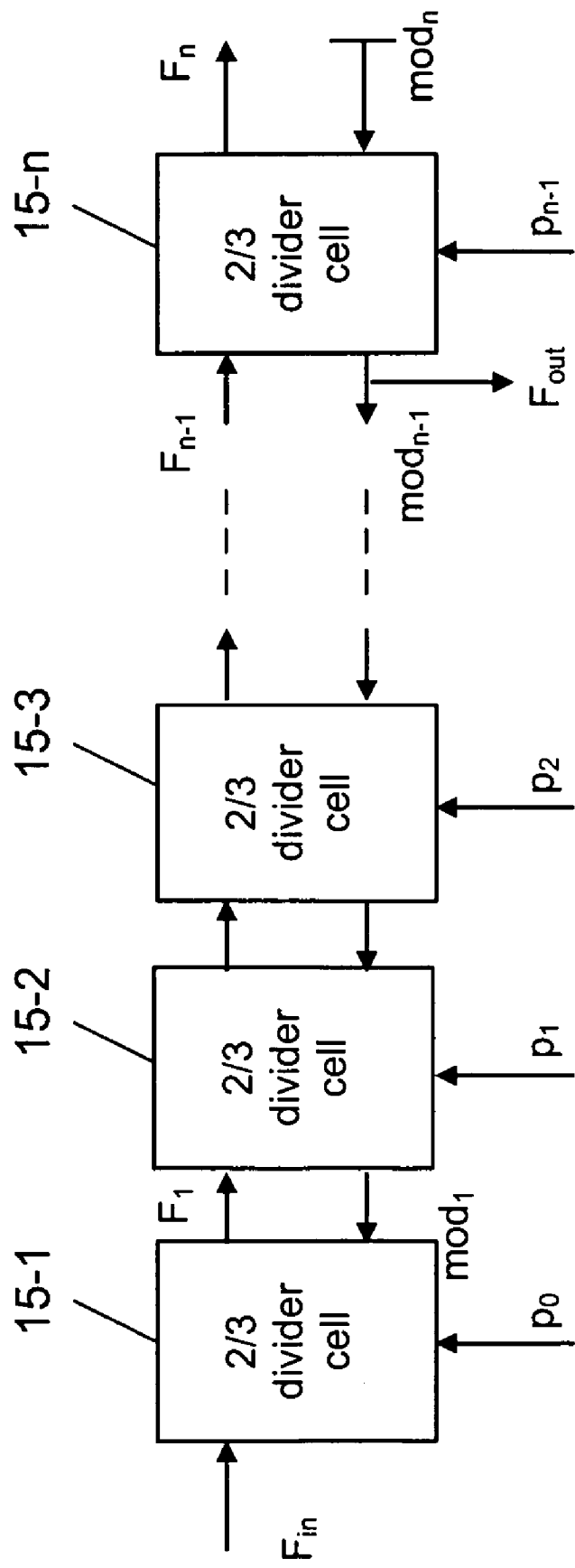
FIG. 1 is a schematic block diagram of a conventional modular frequency divider.

The structure of the divider chain corresponds exactly to the structure of the divider chain presented above with reference to FIG. 1.

Thus, each divider cell 26-1 to 26-n includes two functional blocks (not shown).

The first functional block of a divider cell 26-x is a prescaler logic block, which divides the frequency of an input signal and which outputs a frequency divided signal $F_x$, where x=1 to n is the ordinal number of a respective divider cell. For the frequency division, the prescaler logic block can use a division ratio of two or a division ratio of three. The signal $F_x$ output by the n−1 first divider cells 26-x =26-1 to 26-(n−1) is provided to the respective next divider cell 26-(x+1)=26-2 to 26-(n) in the divider chain.

The second functional block of a divider cell 26-1 to 26-n is an end-of-cycle logic block, which determines the division ratio to be used by the prescaler logic block of the same divider cell. The end-of-cycle logic block of each divider cell 26-1 to 26-n receives a dedicated control signal $p_0$ to $p_{n-1}$ via a programming input. The end-of-cycle logic block of the last divider cell 26-n in the divider chain receives in addition a fixed end-of-cycle signal $mod_n$ via a feedback input. The end-of-cycle logic block of all other divider cells 26-x, with x=1 to (n−1), receives in addition via a feedback input an end-of-cycle signal $mod_x$ output by the end-of-cycle logic block of the respective next divider cell 26-(x+1) in the divider chain.

The divider cells 26-1 to 26-n can be programmed by setting the division ratio control signals $p_0$ to $p_{n-1}$.

In the frequency divider 25, moreover a respective latch 27-1 to 27-n is associated to each divider cell 26-1 to 26-n. A respective output of the delta-sigma modulator 24 is connected to an input of each of the latches 27-1 to 27-n. Further, the output of the end-of-cycle logic of the last divider cell 26-n is connected in addition to a control input of all latches 27-1 to 27-n. , while the output of each latch 27-1 to 27-n is connected to a programming input of the respectively associated divider cell 26-1 to 26-n.

Finally, an output of the signal generator 23 is connected to the prescaler logic block of the first divider cell 26-1.

When an RF signal is to be transmitted from the mobile station 20 to the base station 30, the signal generator 23 provides an RF signal Fin having a known radio frequency to the first divider cell 26-1 of the divider chain. The divider chain divides the frequency of the received signal Fin based on a respectively provided set of division ratio control signals $p_0$ to $p_{n-1}$, as presented in the above cited document "A Family of Low-Power Truly Modular Programmable Dividers in Standard 0.35-μm CMOS Technology", which is incorporated by reference herein for background.

During a division operation, the first divider cell 26-1 thus divides the input signal $F_{in}$ and provides the frequency divided signal $F_1$ to the second divider cell 26-2. Each further divider cell 26-x , with x=2 to n, receives a signal $F_{x-1}$ from the respective preceding divider cell 26-(x−1) in the division chain and outputs a further frequency divided signal $F_x$. By default, each divider cell 26-1 to 26-n divides an input signal by two.

Upon completion of a division cycle, the last divider cell 26-n in the divider chain generates an end-of-cycle signal $mod_{n-1}$, which propagates with each clock cycle of a respective input signal $F_x$ to a respective preceding divider cell 26-x as an end-of-cycle signal $mod_x$, with x=n−1 down to 1. The term division cycle refers to the current clock period of the signal $F_n$ output by the last divider cell 26-n. The signal $mod_{n-1}$ forms at the same time the output signal $F_{out}$ of the frequency divider 25.

When the end-of-cycle signal $mod_x$ becomes active at the feedback input of an end-of-cycle logic block, the end-of-cycle logic block controls the prescaler logic block of the same divider cell 26-x in a way that the division ratio applied by the prescaler logic block is two or three. An active signal $mod_x$ at the feedback input enables a divider cell 26-x to divide the frequency of an input signal $F_{x-1}$ once by three, provided that the control signal $p_{x-1}$ at the programming input is set to '1'. If the division ratio control signal $p_{x-1}$ is set to '0' when the end-of-cycle signal $mod_x$ becomes active, the prescaler logic block of the divider cell 26-x continues dividing the received signal $F_{x-1}$ by two.

Moreover, the delta-sigma modulator 24 receives a fixed reference frequency $F_{ref}$ that may be derived from a system clock. The delta-sigma modulator 24 selects division ratio control signals $p_0$ to $p_{n-1}$, which result in a total division ratio of the divider chain required for achieving the desired output frequency. The selection is carried out by the delta-sigma modulator 24 after each period of the reference frequency. For an Integer-N division, the same set of division ratio control signals will be selected after each period of the reference frequency $F_{ref}$, a respective set comprising one control signal for each divider cell 26-1 to 26-n. For a Fractional-N division, a new set of division ratio control signals will be selected after each period of the reference frequency $F_{ref}$.

Figure 3:
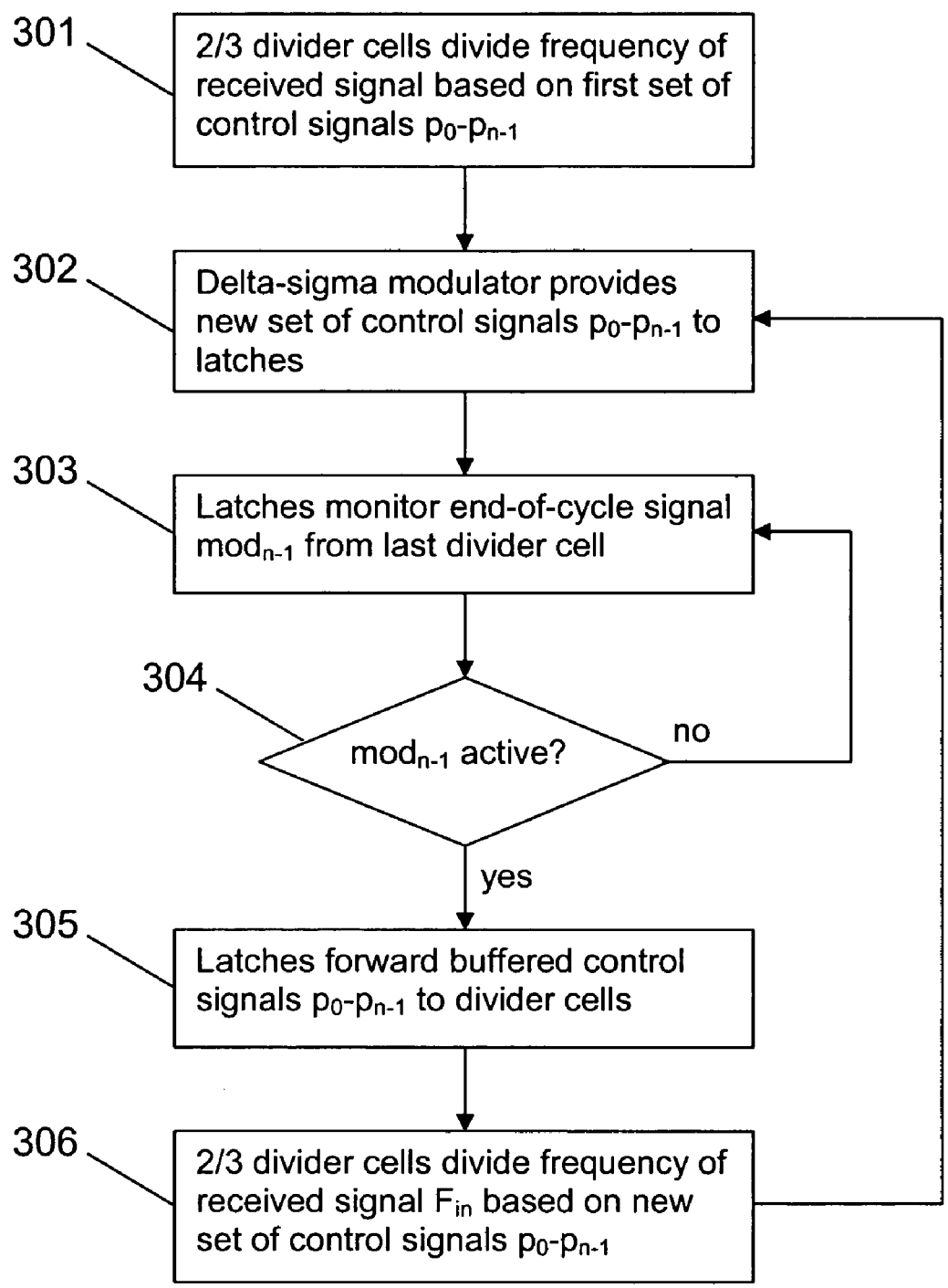
FIG. 3 is a flow chart illustrating the operation in the system of FIG. 1.

The switching between different sets of division ratio control signals in the system of FIG. 2 during a Fractional-N division will now be described with reference to the flowchart of FIG. 3.

The divider chain starts off with dividing the frequency of a signal $F_{in}$ received by the radio frequency generator 23 with a first set of division ratio control signals $p_0$ to $p_{n-1}$ (step 301). The first set of division ratio control signals $p_0$ to $p_{n-1}$ can be for example a default set.

In the case of a Fractional-N division, the delta-sigma modulator 24 outputs varying sets of division ratio control signals $p_0$ to $p_{n-1}$ with each period of the reference frequency $F_{ref}$. A respectively new set of division ratio control signals $p_0$ to $p_{n-1}$ is not provided directly to the programming inputs of the divider cells 26-1 to 26-n, though. Instead, each division ratio control signal $p_{x-1}$ of a new set of control signals $p_0$ to $p_{n-1}$ is provided to the latch 27-x having a corresponding ordinal number x (step 302). Each latch 27-1 to 27-n buffers the received division ratio control signal $p_0$ to $p_{n-1}$.

An end-of-cycle signal $mod_{n-1}$ output by the last divider cell 26-n is provided in addition to the control input of all latches 27-1 ... 27-n. Each latch 27-1 to 27-n monitors whether the end-of-cycle signal $mod_{n-1}$ becomes active (step 303).

As long as it is determined that no active end-of-cycle signal $mod_{n-1}$ is received (step 304), the monitoring is continued (step 303).

When the latches 27-1 to 27-n determine, in contrast, that an active end-of-cycle signal $mod_{n-1}$ is received (step 304), they forward the buffered division ratio control signals $p_0$ to $p_{n-1}$ to the divider cells 26-1 to 26-n (step 305).

Thereupon, the divider cells 26-1 to 26-n proceed with a new division cycle which is based on the new set of division ratio control signals $p_0$ to $p_{n-1}$ (step 306).

The procedure is repeated beginning with step 302 as soon as new control signals are required again, that is, with each new period of the reference frequency $F_{ref}$.

The signal $F_{out}$ output by the frequency divider 25 can then be further processed in the frequency synthesizer 22. For example the output signal $F_{out}$ could be connected to a phase frequency detector input of an Integer-N or a Fractional-N PLL.

A Fractional-N PLL typically includes a phase frequency detector (not shown), which is connected via a charge pump (not shown) and a loop filter (not shown) to the signal generator 23. The output of the signal generator 23 corresponds in this case to the output of the PLL frequency synthesizer 22 and is connected in addition to the input of the frequency divider 25. The output of the frequency divider 25 is connected to the phase frequency detector. The delta-sigma modulator 24 may either receive the output signal of the frequency divider 25 or alternatively a reference clock $F_{ref}$, as indicated in FIG. 2.

An Integer-N PLL typically comprises the same components as a Fractional-N PLL, except for the delta-sigma modulator 24.

The PLL frequency synthesizer 22 can be used for instance for providing a local oscillator signal for a transmitter chain as a carrier frequency for a signal which is to be transmitted to the base station 30, or for providing a local oscillator signal for a receiver chain processing signals received from the base station 30.

It becomes apparent that with the presented approach, a programming of the divider chain with new division ratio control signals is synchronized with a respective division cycle. Thereby, the use of two different sets of division ratio control signals by the divider cells 26-1 to 26-n within a single division cycle can be avoided.

It is to be understood that a corresponding RF front-end could be implemented in the base station 30 as well. It is only of particular advantage for a mobile device 20, as here the power reduction enabled by the modular architecture is of particular relevance.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of operating a frequency divider, which frequency divider includes a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain, said method comprising:

receiving and buffering a new division ratio control signal for each of said divider cells; and synchronizing an application of said buffered division ratio control signals to said divider cells with a status of a current division cycle.

2. The method according to claim 1, wherein each of said divider cells uses a first one of said at least two division ratios by default, wherein said last divider cell in said chain provides an end-of-cycle signal whenever it has completed a division cycle, wherein an end-of-cycle signal provided by said last divider cell propagates from said last divider cell via all divider cells in said chain to a first divider cell in said chain, each divider cell using said second one of said at least two division ratios once when receiving an end-of-cycle signal, if required by a currently applied division ratio control signal, and wherein said status of a division cycle is related to said end-of-cycle signal.

3. The method according to claim 1, wherein said last divider cell in said chain provides an end-of-cycle signal whenever it has completed a division cycle, wherein synchronizing an application of buffered division ratio control signals comprises monitoring a presence of an end-of-cycle signal provided by said last divider cell and forwarding buffered division ratio control signals to said divider cells whenever such an end-of-cycle signal is detected.

4. The method according to claim 1, wherein said at least two division ratios comprise a first division ratio of two and a second division ratio of three.

5. A frequency divider comprising:

a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain; and at least one synchronization component adapted to receive and buffer a new division ratio control signal for each of said divider cells, to apply said buffered division ratio control signal to said divider cells, and to synchronize an application of said buffered division ratio control signals to said divider cells with a status of a current division cycle.

6. The frequency divider according to claim 5, wherein each of said divider cells is adapted to use a first one of said at least two division ratios by default, wherein said last divider cell in said chain is adapted to provide an end-ofcycle signal whenever it has completed a division cycle, wherein said divider cells are adapted to cause a propagation of an end-of-cycle signal provided by said last divider cell from said last divider cell via all divider cells in said chain to a first divider cell in said chain, each divider cell being adapted to use said second one of said at least two division ratios once when receiving an end-of-cycle signal, if required by a currently applied division ratio control signal, and wherein said status of a division cycle is related to said end-of-cycle signal.

7. The frequency divider according to claim 5, wherein said last divider cell in said chain is adapted to provide an end-of-cycle signal whenever it has completed a division cycle, and wherein for synchronizing an application of buffered division ratio control signals, said at least one synchronization component is adapted to monitor a presence of an end-of-cycle signal provided by said last divider cell and to forward buffered division ratio control signals to said divider cells whenever such an end-of-cycle signal is detected.

8. The frequency divider according to claim 5, wherein said at least one synchronization component comprises a plurality of latches, each latch being associated to a different one of said divider cells, each latch being adapted to receive and buffer a control signal for an associated divider cell and to forward a buffered control signal to said divider cell upon receipt of a predetermined signal.

9. The frequency divider according to claim 5, wherein each of said divider cells is a 2/3 divider cell which is adapted to divide an input signal either with a division ratio of two or with a division ratio of three.

10. A phase-locked-loop frequency synthesizer comprising a frequency divider with:
 a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain; and
 at least one synchronization component adapted to receive and buffer a new division ratio control signal for each of said divider cells, to apply said buffered division ratio control signal to said divider cells, and to synchronize an application of said buffered division ratio control signals to said divider cells with a status of a current division cycle.

11. The phase-locked-loop frequency synthesizer according to claim 10, wherein said phase-locked-loop frequency synthesizer is adapted to operate with control signals for a division of a frequency with at least one of an integer division ratio and/or a fractional division ratio.

12. A radio front-end for a communication device, said radio front-end comprising a frequency divider with:
 a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain; and
 at least one synchronization component adapted to receive and buffer a new division ratio control signal for each of said divider cells, to apply said buffered division ratio control signal to said divider cells, and to synchronize an application of said buffered division ratio control signals to said divider cells with a status of a current division cycle.

13. A communication device comprising a frequency divider with:
 a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain; and
 at least one synchronization component adapted to receive and buffer a new division ratio control signal for each of said divider cells, to apply said buffered division ratio control signal to said divider cells, and to synchronize an application of said buffered division ratio control signals to said divider cells with a status of a current division cycle.

14. The communication device according to claim 13, wherein said communication device is a mobile terminal.

15. A communication system comprising at least one communication device with a frequency divider, which frequency divider includes:
 a plurality of divider cells arranged in a chain, each divider cell being adapted to divide a frequency of an input signal with one of at least two enabled division ratios in accordance with an applied division ratio control signal, and each divider cell but the last one in said chain being adapted to provide a frequency divided signal as an input signal for a respective next divider cell in said chain; and
 at least one synchronization component adapted to receive and buffer a new division ratio control signal for each of said divider cells, to apply said buffered division ratio control signal to said divider cells, and to synchronize an application of said buffered division ratio control signals to said divider cells with a status of a current division cycle.

* * * * *